United States Patent [19]

Koshimaru

[11] Patent Number: 4,631,425
[45] Date of Patent: Dec. 23, 1986

[54] LOGIC GATE CIRCUIT HAVING P- AND N-CHANNEL TRANSISTORS COUPLED IN PARALLEL

[75] Inventor: Shigeru Koshimaru, Tokyo, Japan
[73] Assignee: NEC, Tokyo, Japan
[21] Appl. No.: 575,596
[22] Filed: Jan. 31, 1984
[30] Foreign Application Priority Data
    Jan. 31, 1983 [JP] Japan .................. 58-14197
[51] Int. Cl.$^4$ ........................... H03K 19/096
[52] U.S. Cl. ...................... 307/449; 307/443; 307/451; 307/463; 307/585
[58] Field of Search ............ 307/443, 448, 449, 463, 307/451–453, 469, 576, 579, 585; 365/230

[56] References Cited

U.S. PATENT DOCUMENTS

| | | | |
|---|---|---|---|
| 3,651,342 | 3/1972 | Dingwall | 307/585 |
| 4,041,459 | 8/1977 | Horninger | 307/463 X |
| 4,042,915 | 8/1977 | Reed | 307/463 X |
| 4,074,151 | 2/1978 | Buckley, III et al. | 307/443 X |
| 4,350,905 | 9/1982 | Sato | 307/451 |
| 4,518,875 | 5/1985 | Aytac | 307/451 X |

FOREIGN PATENT DOCUMENTS 0041579  4/1981  Japan ......................... 307/449

*Primary Examiner*—Stanley D. Miller
*Assistant Examiner*—D. R. Hudspeth
*Attorney, Agent, or Firm*—Sughrue, Mion, Zinn Macpeak & Seas

[57] ABSTRACT

A logic circuit on a semiconductor chip having a decoding or a selecting function has at least two input transistors coupled in parallel between an output node and a reference point. Input signals are applied to the input transistors, and an output is derived from the output node. Instead of employing inverters to produce complement signals, a conductivity of one input transistor is made different from that of the other input transistors. The proposed logic circuit can decode or select a combination pattern of input signals without using a complement signal producing circuit. Therefore, the number of circuit elements and signal lines are decreased.

8 Claims, 14 Drawing Figures

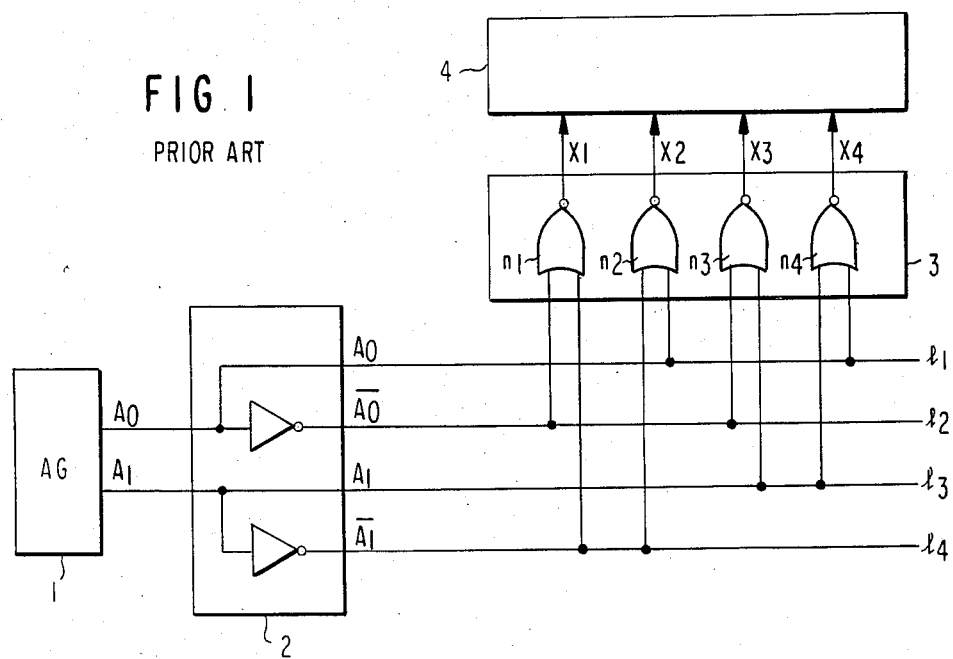
FIG. 1 PRIOR ART
FIG. 2
| $A_0$ | $A_1$ | $X_1$ | $X_2$ | $X_3$ | $X_4$ |
|---|---|---|---|---|---|
| 1 | 1 | 1 | 0 | 0 | 0 |
| 0 | 1 | 0 | 1 | 0 | 0 |
| 1 | 0 | 0 | 0 | 1 | 0 |
| 0 | 0 | 0 | 0 | 0 | 1 |
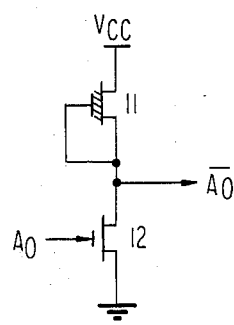
FIG. 3 PRIOR ART

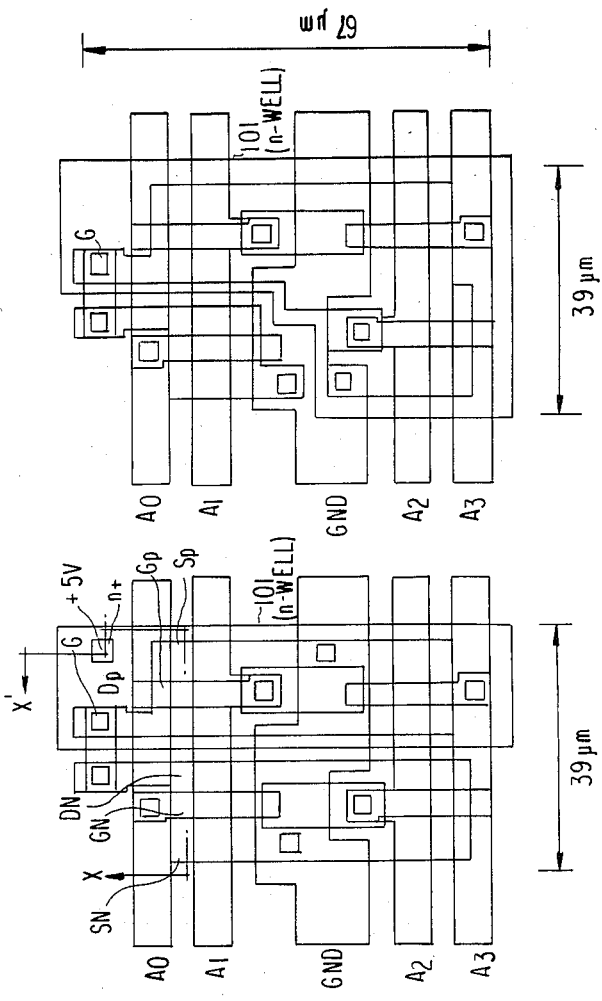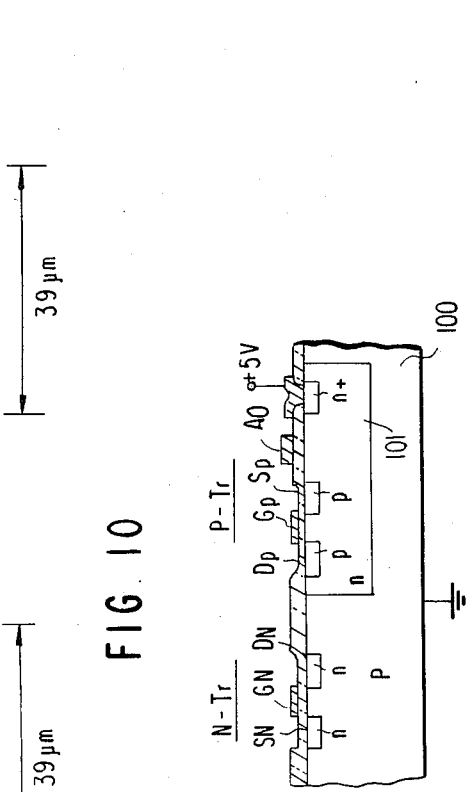

LOGIC GATE CIRCUIT HAVING P- AND N-CHANNEL TRANSISTORS COUPLED IN PARALLEL

FIELD OF THE INVENTION

The present invention relates to a logic circuit, and more particularly to an integrated circuit which includes an inversion function for inverting a logic level of a signal.

DESCRIPTION OF THE PRIOR ART

In digital processing, recently the number of digital data bits to be manipulated has increased. Further, in general two digital signals, that is a true signal and a complement signal, are used for one digital data bit. The complement signal is produced by inverting a logic level of the true signal. Therefore, many inverter circuits are required in a logic circuit to produce complement signals of digital data bits to be manipulated therein. However, the increase in inverter circuits is a problem for LSI circuits and highly digitized processor because of the large area for inverter circuits required on a semiconductor chip. As a result, fewer functional elements are integrated on the chip.

Further, the number and length of signal lines required to transfer digital signals within a chip is increased. Therefore, stray capacitances of the signal lines increases, slowing the propagation speed of a digital signals. The result is that data transmission cannot be accomplished at a high speed. Particularly, since the number of inputs to an address decoder and the length of input signal lines connected to the input terminals of the address decoder are required to be twice the number of input address signals, the above-mentioned problems are particularly severe in a digital processor which includes a memory or registers to be controlled by address signals.

SUMMARY OF THE PRESENT INVENTION

An object of the present invention is to provide a logic circuit capable of being realized on a small chip area.

Another object of the present invention is to provide a novel logic circuit to manipulate a true logic signal and a complement logic signal.

Still another object of the present invention is to provide an integrated logic circuit having a simple addressing structure.

A logic circuit of the present invention has a plurality of parallel-connected insulated-gate field effect transistors between an output node and a reference potential point. At least one of the transistors is a P-channel type transistor and the other is an N-channel transistor. Means for driving the output node is coupled to the output node and a plurality of input signals are applied, without being inverted, to the respective gate electrodes of the transistors. The input signals are all true signals, and instead of providing an inverter to produce a complement signal, the different channel type transistor is used.

According to the present invention, the logic circuit has an NOR gate function and may be used as a decoder, decoding a plurality of combinations of logic levels of input signals, or as a selector. Particularly, input signals are decoded or selected by a combination of the plurality of transistors of one conductivity (N-channel or P-channel) and the other conductivity (P-channel or N-channel). Therefore, the input signals can be directly applied to the gate electrodes of the transistors. That is, according to the present invention, complement signals of the input signals and circuits for producing the complement signals are not required. For example, when two address signals ($A_0$ and $A_1$) are supplied to a memory, the prior art has required two complement signals ($\overline{A_0}$ and $\overline{A_1}$). However, the present invention requires only two address signals ($A_0$ and $A_1$) and does not require two inverters to invert logic levels of the address signals ($A_0$ and $A_1$) to produce the complement signals.

Therefore, the number of signal lines between the address signal input terminals and the logic circuit is reduced by half. Of course, a circuit to produce complement signals from the input signals is unnecessary. Further, if many logic circuits are required, they are coupled to the respective input signal lines. Therefore, a design of a circuit pattern is very simple, and stray capacitances of input signal lines are reduced remarkably. As a result, the logic circuit of the present invention can achieve a high speed operation.

BRIEF DESCRIPTION OF THE DRAWINGS

FIG. 1 is a block diagram of a memory access circuit of the prior art;

FIG. 2 is an addressing table of 2 bits addressing;

FIG. 3 is an invertor circuit of the prior art for producing a complement signal;

FIG. 8 is a plan view diagram of an input portion of a decoder which decodes 4 bit addresses in the prior art;

FIGS. 9(a) and 9(b) are plan view diagrams of input portions of a decoder for decoding 4 bit addresses, respectively, in the present invention; and FIG. 10 is a cross sectional view along X—X' of FIG. 9(b).

DETAILED DESCRIPTION OF PRIOR ART

Figure 4:
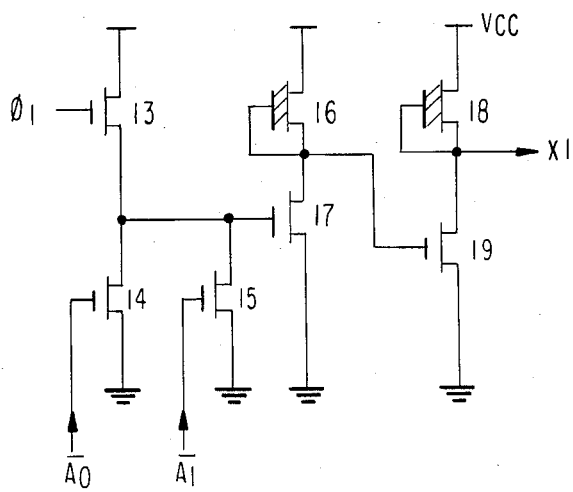
FIG. 4 is a decoding circuit of the prior art for decoding an address.

FIG. 1 shows a memory access circuit of two address bits $A_0$ and $A_1$ of the prior art. Two address bits $A_0$ and $A_1$ are generated by an address generator 1 and transferred to a complement signal producing circuit 2, which has two inverter circuits corresponding to two address bits $A_0$ and $A_1$. As a result, complement signals $\overline{A_0}$ and $\overline{A_1}$ are produced and are transferred to a decoding circuit 3 together with true signals $A_0$ and $A_1$ through four signals lines ($l_1$ to $l_4$). The decoding circuit 3 has four NOR gates $n_1$ to $n_4$, each of which is connected to two signal lines $l_2$ and $l_4$, $l_1$ and $l_4$, $l_2$ and $l_3$, and $l_1$ and $l_3$, respectively. Only one output among four outputs $X_1$ to $X_4$ of the decoding circuit 3 is activated according to an address bit pattern $A_0$ and $A_1$. The decoding status is shown in FIG. 2 wherein "1" means an activated output of the decoding circuit 3. Four outputs $X_1$ to $X_4$ are supplied to a memory circuit 4 having four memory cells, four memory banks, four memory blocks, or the like.

An inverter circuit of the complement signal producing circuit 2 is shown in FIG. 3. This circuit has a load transistor 11 in which a gate electrode and a source electrode are connected to an output node and a driver transistor 12 in which a drain electrode is connected to the output node. A drain electrode of the load transistor 11 is coupled to Vcc, and a source electrode of the driver transistor 12 is connected to GND. The address bit $A_0$ is applied to an input electrode of the driver transistor 12. The same circuit is used as the other invertor circuit to which the other address bit $A_1$ is applied. The two transistors, as an example may be N channel MOS transistors. FIG. 3 shows an E/D MOS inverter circuit in which transistor 11 and transistor 12 are a depletion type and an enhancement type, respectively.

Each of the NOR gates $n_1$ to $n_4$ has a circuit construction shown in FIG. 4. Transistors 13, 14 and 15 are N-channel MOS transistors, and transistors 16, 17 and 18, 19 are E/D MOS inverters. Before address signals $\overline{A_0}$ and $\overline{A_1}$ are applied to gate electrodes of transistors 14 and 15, a clock signal $\phi$, is applied to a gate electrode of the transistor 13. As a result, the gate electrode of the transistor 17 is charged at high level and then is turned on. Then, a gate voltage level of the transistor 19 becomes a low level and is turned off (cut off). At this stage, the voltage level of $X_1$ becomes a high level. This is the waiting status of the decoding circuit 3.

When either one or both of the address signals $\overline{A_0}$ and $\overline{A_1}$ are of high levels, either one or both of the transistors 14 and 15 are turned on. Therefore, the transistors 17 and 19 are turned off and turned on, respectively. The output $X_1$ becomes a low level ("0"). Consequently, the NOR gate of FIG. 4 produces a high level output only when address signals $\overline{A_0}$ and $\overline{A_1}$ are both low levels, that is, input address bits $A_0$ and $A_1$ are both high levels.

Thus, the prior art memory access circuit of FIG. 1 needs two inverter circuits and four signal lines $l_1$ to $l_4$. Further, each NOR gate has to be connected to a different combination of signal lines. Therefore, the number of transistors and signal lines increases and the length of the signal lines also increases. This is a significant problem in LSI circuitry and in a high speed processing.

DESCRIPTION OF THE PREFERRED EMBODIMENT OF THE PRESENT INVENTION

Figure 5:
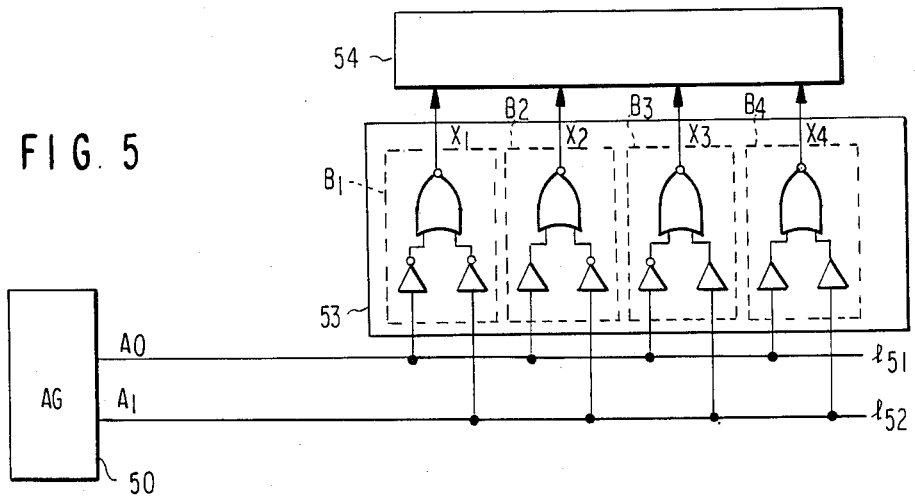
FIG. 5 is a block diagram of a memory access circuit according to one embodiment of the present invention.

FIG. 5 is a block diagram of the embodiment which forms a memory access circuit for a two bit address. An address generator 50 (corresponding to AGI of FIG. 1) generates two address signals $A_0$ and $A_1$. These address signals $A_0$ and $A_1$ are directly transferred through two signals lines $l_{51}$ and $l_{52}$ without a complement signal producing circuit such as circuit 2 of FIG. 1. A decoding circuit 53 has four blocks $B_1$ to $B_4$, each of which has two input ends coupled to the signal lines $l_{51}$ and $l_{52}$ in common. The respective blocks $B_1$ to $B_4$ are shown in more detail in FIGS. 6(a), 6(b), 6(c) and 6(d), respectively. Decoded outputs $X_1$ to $X_4$ are applied to a memory circuit 54 (corresponding to the circuit 4 of FIG. 1).

Figure 6A:
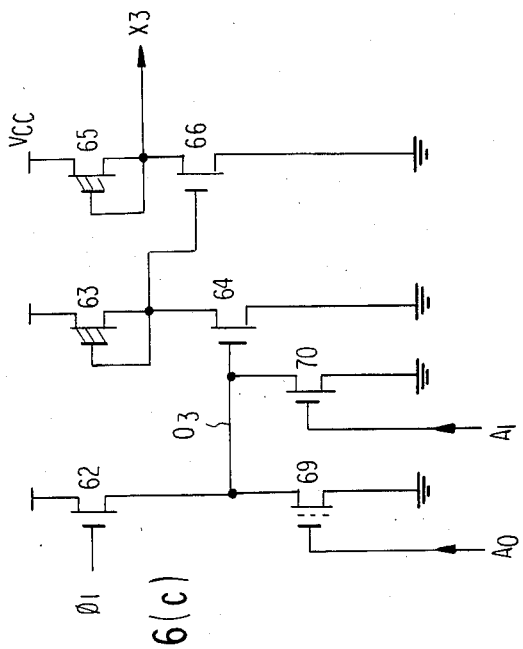
FIGS. 6(a), 6(b), 6(c) and 6(d) are decoding circuits of the present invention, respectively.
Figure 6C:
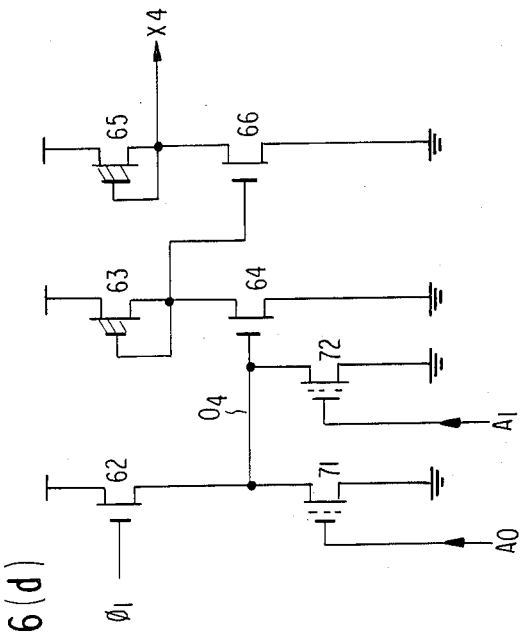
Figure 6B:
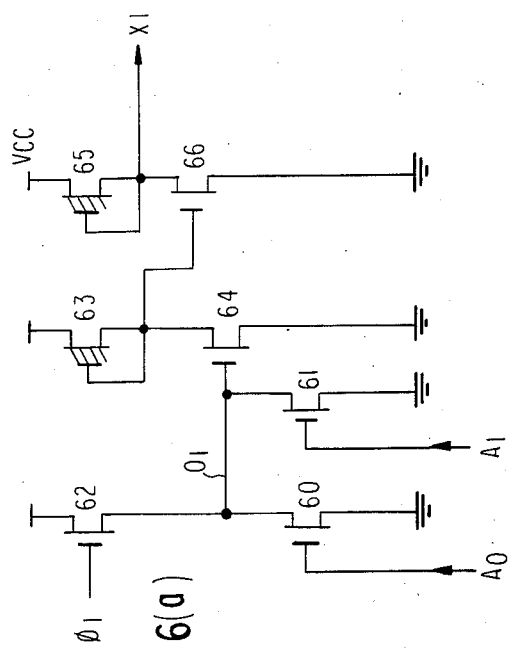
Figure 6D:
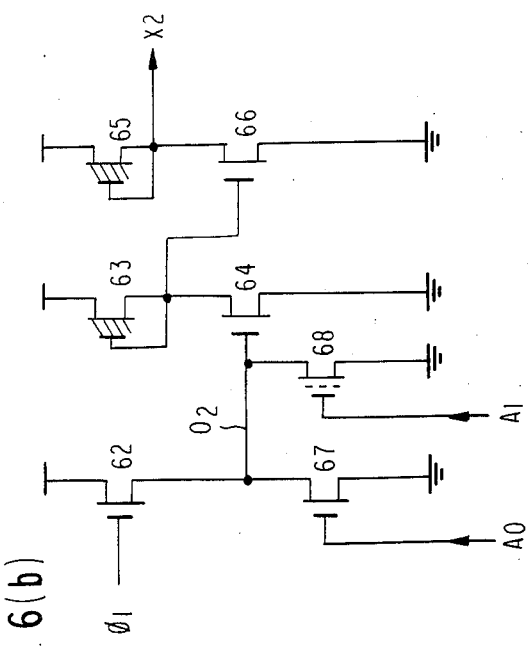

In this embodiment, an N-channel transistor and/or P-channel transistor is used as an input transistor of the decoding circuit 53. The gate threshold voltage of the N-channel transistor is different from that of the P-channel transistor. That is, the N-channel transistor turns on at a high level gate voltage and turns off at a low level, whereas the P-channel transistor turns on at a low level and turns off at a high level. In FIG. 6, input transistors 60, 61, 67 and 70 are N-channel input transistors, while transistors 68, 69, 71 and 72 are P-channel transistors. This means that the input stages of four blocks $B_1$ to $B_4$ are provided with a combination of P-channel and/or N-channel trasistors. It is clear that this combination corresponds to a combination of a true signal and a complement signal of the prior art. Namely, the input transistors 60 and 61 of FIG. 6(a) are N-channel transistors and turn off simultaneously only when address bits $A_0$ and $A_1$ are low levels. The transistors 67 and 68 of FIG. 6(b) are N-channel and P-channel transistors, respectively, and turn off simultaneously only when address bits $A_0$ and $A_1$ are at a low level and a high level, respectively. Transistors 69 and 70 of FIG. 6(c), that is block $B_3$, are P-channel and N-channel transistors, respectively, and turn off simultaneously only when address bits $A_0$ and $A_1$ are at a high level and a low level, respectively. Further, transistors 71 and 72 of FIG. 6(d) are P-channel transistors and turn off simultaneously only when the address bits $A_0$ and $A_1$ are high levels.

For example, in FIG. 6(b), only the transistor 68 is a P-channel transistor and the remainder are N-channel transistors. When the transistor 68 turns on in response to a low level address $A_1$, a gate voltage level of the transistor 64, that is, an output node $O_2$ of the NOR gate assumes a low level voltage irrespective of the state of the transistor 67. Now, if gate threshold levels of the N-channel transistors and the P-channel transistor are $+1.5$ V and $-0.5$ V, respectively, the gate level of the transistor 64 becomes $+0.5$ V in response to a turning on of the transistor 68. Therefore, the N-channel transistor 64 turns off. The circuits of FIGS. 6(a)–6(d) operate in the same manner as FIG. 4, except that since the two input transistors may be any combination of N-channel and/or P-channel transistors, the input transistors have the same effect as selectively inverting those inputs applied to the N-channel transistors. Each circuit of FIGS. 6(a)–6(d) therefore provides a high level output for a unique combination of $A_0$ and $A_1$.

In each circuit, when the two input transistors are cut off, the X output will be high. Thus the following applies:

$X_1 = \overline{A_0} \cdot \overline{A_1}$
$X_2 = \overline{A_0} \cdot A_1$
$X_3 = A_0 \cdot \overline{A_1}$
$X_4 = A_0 \cdot A_1$.

Figure 7:
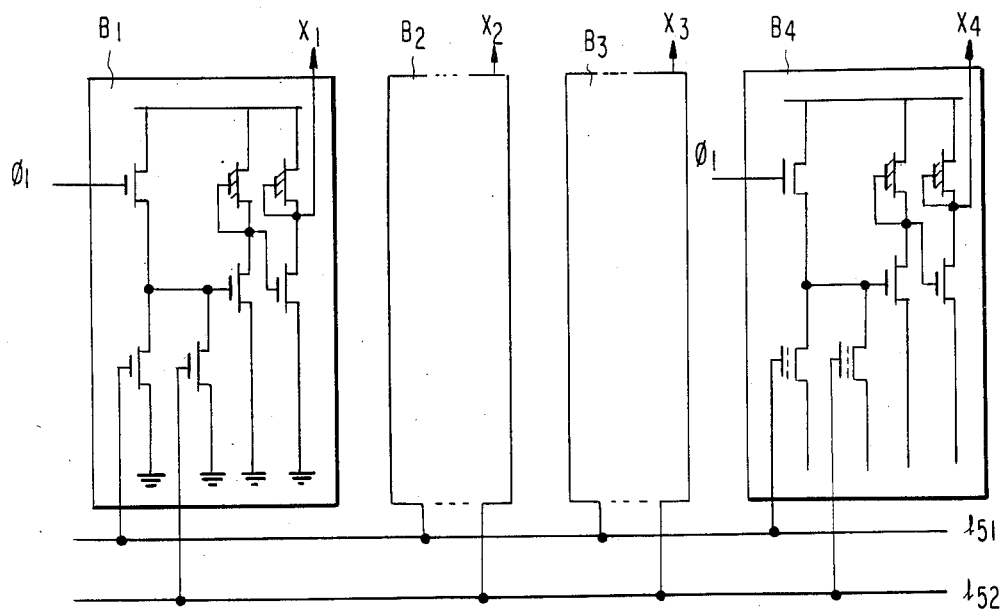
FIG. 7 is a block diagram having four decoding circuits of the present invention.

According to the present invention, the decoding circuit 53 of FIG. 5 is designed as shown in FIG. 7. It is clear that the number of transistor elements in the decoding circuit 53 of the present invention is equal to that in the decoding circuit 5 of the prior art. Therefore, the total number of elements used to in the present invention is decreased relative to the prior art. Specifically, the complement signal producing circuit 2, and two lines $l_2$ and $l_4$ are eliminated. In addition, since the connection of the signal lines $l_{51}$ and $l_{52}$ and each blocks $B_1$ to $B_4$ of the decoding circuit 53 may be the same style, circuit design and pattern design of an LSI becomes easy. Furthermore, the number of signal lines and the length of them can be reduced by the present invention, so that a high speed signal propagation can be achieved.

FIG. 8 shows a plan view of an input stage of a decoding circuit of the prior art wherein the decoding circuit decodes a four bit address $A_0$–$A_3$. A node G is the output end and is coupled to a clocked gate transistor. The prior art requires eight signal lines $A_0$ to $A_3$ and $\overline{A_0}$ to $\overline{A_3}$. The total area of the input stage is 32 $\mu m \times 99$ $\mu m$.

On the other hand, the present invention requires only four signal lines as shown in FIGS. 9(a) and 9(b); FIG. 9(a) shows a plan view of an input stage in which N, P, N and P-channel transistors are coupled in parallel and in the stated order, and FIG. 9(b) shows a plan view of another input stage in which N, P, P and P-channel transistors are coupled in parallel and in the stated order. Each area of the input stage in FIGS. 9(a) and 9(b) is only 39 μm×67 μm.

FIG. 10 shows a cross sectional view along X—X' of FIG. 9(a). An N-channel transistor (N-Tr) is formed in a P type semiconductor substrate 100, and a P channel transistor (P-Tr) is formed in a N-type well 101 of the substrate 100. The substrate 100 is grounded, while +5 V is applied to the N-well. Now, if a threshold voltage of the N-Tr is a +1.5 V and a threshold voltage of the P-Tr is −0.5 V, an effective threshold voltage of the P-Tr becomes +0.8 V because the N-well is biased at +5 V. Therefore, when OV (a low level signal) is applied to a gate $G_P$ of the P-Tr, this P-Tr turns on, and when a high level signal of e.g. +5 V, which is more than +0.8 V, is applied to the gate $G_P$, the P-Tr turns off. When a high level of +5 V, which is more than +1.5 V, is applied to a gate $G_N$ of an N-Tr, this transistor turns on, whereas the N-Tr turns off when a low level of OV, which is less than +1.5 V, is applied thereto.

As described above, a decoding circuit having an N-Tr and a P-Tr can be operated by true logic values of the input address signals.

What is claimed is:

1. A logic circuit comprising a plurality of insulated-gate field effect transistors coupled in parallel with each other between an output node and a reference potential point, means for supplying electric charge to said output node, means for applying each one of a plurality of input signals to only a respective each one of the gate electrodes of said transistors, and means for deriving an output signal from said output node, said output signal taking either one of a first level and a second level, at least one of said transistors being a P-channel type transistor and another being an N-channel type transistor, whereby said output signal takes said first level when at least one P-channel type transistor becomes conductive in response to said input signal applied thereto or at least one N-channel types becomes conductive in response to said input signal applied thereto and said output signal takes said second level when all of said P-channel type transistors and of said N-channel type transistors become non-conductive in response to said plurality of input signals, wherein said input signals may be supplied only in non-complementary form due to the provision of both P-channel and N-channel transistors.

2. A logic circuit on a semiconductor chip comprising:
at least two signal lines;
at least two circuit blocks, each of which has at least two input transistors coupled in parallel with each other and a logic gate means coupled to output ends of said at least two input transistors, one of said at least two input transistors being coupled to one of said at least two signal lines, the other of said input transistors being coupled to the other of said signals lines, and said one input transistor of one of said at least two circuit blocks having a different conductivity type channel from that of said other input transistor in the same circuit block, whereby said logic gate means of said one of said at least two circuit blocks provides an output in response to one of a plurality of combinations of signals on said at least two signal lines, while said logic gate means on another of said at least two circuit blocks provides an output in response to another combination of signals on said at least two signal lines; and
means for deriving said output from said logic gate means, wherein said signals may be supplied only in non-complementary form due to the provision of said input transistors having different conductivity type channels.

3. In an address decoding circuit of the type which responds to an input address of n binary bits by selectively activating one out of $2^n$ output lines, and which includes $2^n$ transistorized logic circuits, each responding to a different one of the $2^n$ unique combinations of the n address bits, the improvement comprising:
signal line means for connecting each of said n address bits, without generation of complementary address signals, to each of said transistorized logic circuits;
each of said transistorized logic circuits having n parallel connected input transistors, each set of n parallel connected input trasistors constituting a unique combination of N-channel and P-channel transistors, whereby said unique combination of transistors determining the said different one of the $2^n$ unique combinations of n address bits to which said logic circuit will respond.

4. An address decoding circuit as claimed in claim 3 wherein each of said logic circuits consists of insulated gate field effect transistors, said n input transistors being coupled in parallel between an output node and a reference potential point, means for driving said output node, means for applying said n address bits to the gate electrodes of said n input transistors, respectively, and means for deriving an output signal from said output node.

5. An address decoding circuit as claimed in claim 4 wherein one of said $2^n$ logic circuits has all N-channel transistors as its input transistors, one of said $2^n$ logic circuits has all P-channel transistors as its input transistors, and the remaining $2^n-2$ logic circuits having a combination of N-channel and P-channel transistors as their input transistors.

6. An address decoding circuit as claimed in claim 3, wherein said logic circuits are formed on a semiconductor chip.

7. An address decoding circuit as claimed in claim 4, wherein said logic circuits are formed on a semiconductor chip.

8. An address decoding circuit as claimed in claim 5, wherein said logic circuits are formed on a semiconductor chip.

* * * * *

UNITED STATES PATENT AND TRADEMARK OFFICE
CERTIFICATE OF CORRECTION

PATENT NO. : 4,631,425

DATED : December 23, 1986

INVENTOR(S) : Shigeru KOSHIMARU

It is certified that error appears in the above-identified patent and that said Letters Patent is hereby corrected as shown below:

COLUMN 1, LINE 17    Delete "a" and insert -- the --

COLUMN 1, LINE 18    Delete "the" and insert -- a --

COLUMN 1, LINE 22    Delete "processor" and insert -- processors --

Title page, item [73] should read as follows:
-- NEC CORPORATION
JAPAN --.

Signed and Sealed this

Twenty-second Day of September, 1987

Attest:

DONALD J. QUIGG

Attesting Officer     Commissioner of Patents and Trademarks